US011863155B2

(12) United States Patent
Daimon et al.

(10) Patent No.: US 11,863,155 B2
(45) Date of Patent: Jan. 2, 2024

(54) SURFACE ACOUSTIC WAVE ELEMENT

(71) Applicant: Murata Manufacturing Co., Ltd., Nagaokakyo (JP)

(72) Inventors: Katsuya Daimon, Nagaokakyo (JP); Akira Michigami, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 918 days.

(21) Appl. No.: 16/540,096

(22) Filed: Aug. 14, 2019

(65) Prior Publication Data
US 2019/0372551 A1 Dec. 5, 2019

Related U.S. Application Data

(63) Continuation of application No. PCT/JP2018/005286, filed on Feb. 15, 2018.

(30) Foreign Application Priority Data

Feb. 22, 2017 (JP) .................. 2017-031360

(51) Int. Cl.
*H03H 9/02* (2006.01)
*H03H 9/145* (2006.01)
*H03H 9/25* (2006.01)

(52) U.S. Cl.
CPC ........ *H03H 9/02559* (2013.01); *H03H 9/145* (2013.01); *H03H 9/25* (2013.01)

(58) Field of Classification Search
CPC ...... H03H 9/02559; H03H 9/145; H03H 9/25; H03H 9/14541; H03H 9/02629; H03H 9/02818; H03H 9/14538
See application file for complete search history.

(56) References Cited

U.S. PATENT DOCUMENTS

| 4,065,734 A | 12/1977 | Takeno et al. |
| 2005/0099091 A1* | 5/2005 | Mishima ............... H03H 9/0222 310/313 R |
| 2008/0061657 A1 | 3/2008 | Matsuda et al. |
| 2008/0067891 A1 | 3/2008 | Matsuda et al. |
| 2009/0243430 A1* | 10/2009 | Yokota ............... H03H 9/14541 310/313 B |
| 2012/0200371 A1* | 8/2012 | Yamashita ............... H03H 3/08 29/25.35 |
| 2013/0162368 A1* | 6/2013 | Tsurunari ............... H03H 9/725 333/195 |

(Continued)

FOREIGN PATENT DOCUMENTS

| JP | 52-9389 A | 1/1977 |
| JP | 2008-078739 A | 4/2008 |

(Continued)

OTHER PUBLICATIONS

Official Communication issued in International Patent Application No. PCT/JP2018/005286 dated Mar. 13, 2018.

*Primary Examiner* — Eugene Yun
(74) *Attorney, Agent, or Firm* — Keating & Bennett, LLP

(57) ABSTRACT

A surface acoustic wave element includes a substrate including a LiNbO₃ piezoelectric single crystal, a first dielectric layer provided on the substrate, and an IDT electrode provided on the first dielectric layer, and propagates a high-frequency signal on the substrate using a Rayleigh wave.

20 Claims, 3 Drawing Sheets

(56) References Cited

U.S. PATENT DOCUMENTS

| | | | |
|---|---|---|---|
| 2014/0035436 A1* | 2/2014 | Ruile | H03H 9/25 29/25.35 |
| 2014/0232239 A1 | 8/2014 | Iwasaki et al. | |
| 2017/0012338 A1* | 1/2017 | Wang | H03H 9/2405 |
| 2017/0026025 A1* | 1/2017 | Jäger | H03H 9/02543 |
| 2017/0155373 A1* | 6/2017 | Ruby | H03H 9/02574 |

FOREIGN PATENT DOCUMENTS

| | | |
|---|---|---|
| JP | 2015-056712 A | 3/2015 |
| KR | 10-2008-0023652 A | 3/2008 |

\* cited by examiner

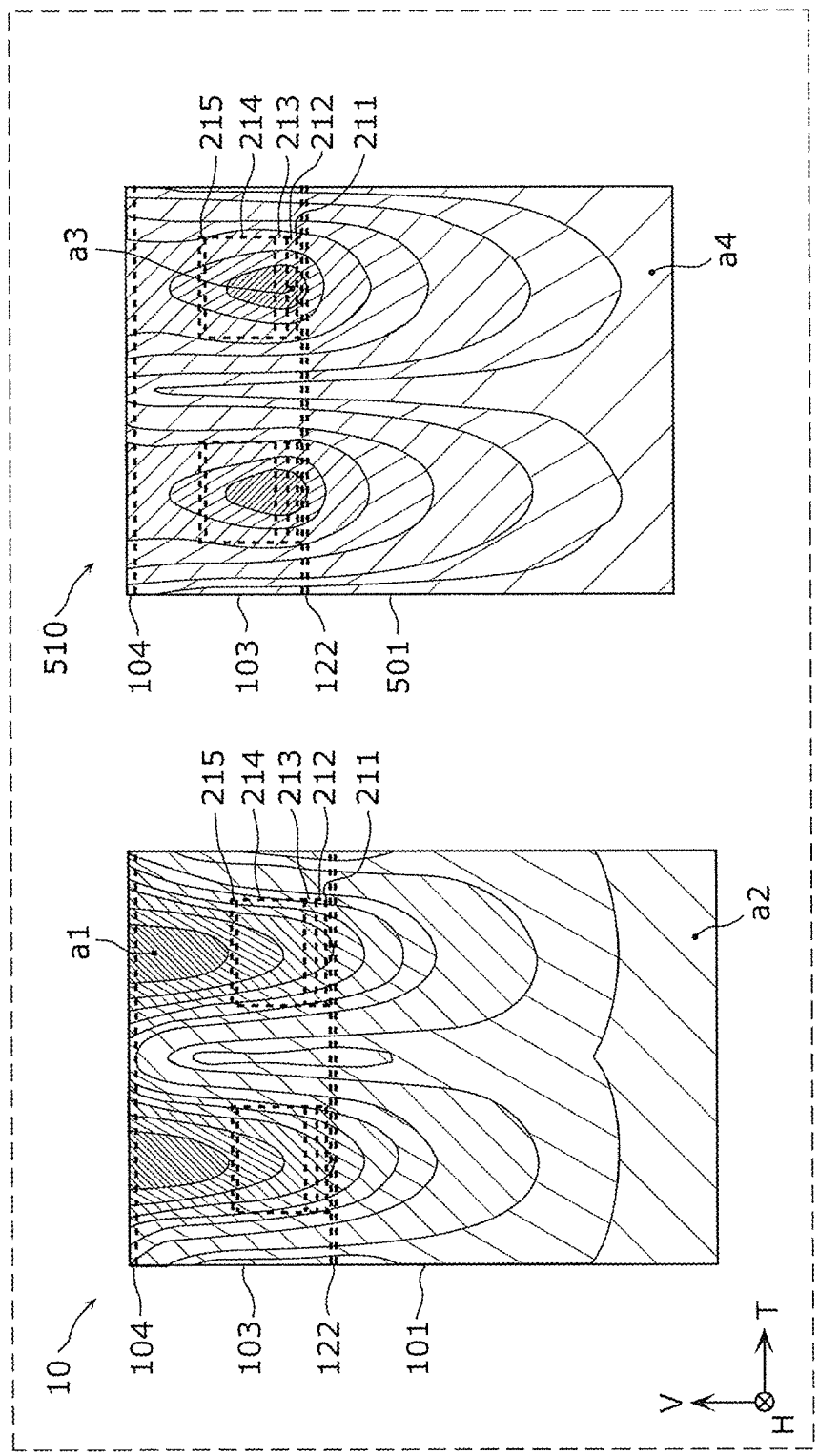

SURFACE ACOUSTIC WAVE ELEMENT

CROSS REFERENCE TO RELATED APPLICATIONS

This application claims the benefit of priority to Japanese Patent Application No. 2017-031360 filed on Feb. 22, 2017 and is a Continuation Application of PCT Application No. PCT/JP2018/005286 filed on Feb. 15, 2018. The entire contents of each application are hereby incorporated herein by reference.

BACKGROUND OF THE INVENTION

1. Field of the Invention

The present invention relates to a surface acoustic wave element including an interdigital transducer (IDT) electrode.

2. Description of the Related Art

Conventionally, surface acoustic wave elements using acoustic waves have been widely used in a band-pass filter or the like disposed in a front-end portion of a mobile communication device.

For example, as a surface acoustic wave element corresponding to a band-pass filter, a configuration has been known in which a dielectric layer made of aluminum oxide is provided on a 30° Y-cut X-propagation lithium niobate substrate, and an IDT electrode is provided on the dielectric layer (see, for example, Japanese Unexamined Patent Application Publication No. 2008-78739).

In the surface acoustic wave element disclosed in Japanese Unexamined Patent Application Publication No. 2008-78739, a thickness and a material of a dielectric layer are appropriately selected to adjust an electromechanical coupling coefficient, so that a band width ratio ((anti-resonant frequency−resonant frequency)/resonant frequency×100) is able to be determined. However, there is a problem in that variations in the band width ratio occur in a plurality of surface acoustic wave elements after manufacturing due to variations in the thickness of the dielectric layers occurring in a manufacturing process of the surface acoustic wave elements.

SUMMARY OF THE INVENTION

Preferred embodiments of the present invention provide surface acoustic wave elements in each of which variations in band width ratios of the surface acoustic wave elements are reduced or prevented.

A surface acoustic wave element according to a preferred embodiment of the present invention includes a substrate including a $LiNbO_3$ piezoelectric single crystal, a first dielectric layer provided directly or indirectly on the substrate, and an IDT electrode provided directly or indirectly on the first dielectric layer, in which a high-frequency signal is propagated on the substrate using a Rayleigh wave.

In a surface acoustic wave element that propagates the high-frequency signal using the Rayleigh wave, since a region having a large amplitude in signal propagation is spaced away from the substrate and the first dielectric layer, variations in the band width ratios of the surface acoustic wave elements are able to be reduced or prevented even when variations in the thickness of the first dielectric layers occur during manufacturing.

Further, a Y-cut angle of the $LiNbO_3$ piezoelectric single crystal may be equal to or larger than about 100° and equal to or smaller than about 160°.

Since the Y-cut angle of the $LiNbO_3$ piezoelectric single crystal is equal to or larger than about 100° and equal to or smaller than about 160°, an electromechanical coupling coefficient is increased within a range of the Y-cut angle, and the surface acoustic wave element is structured to easily propagate the high-frequency signal by using the Rayleigh wave. Thus, the region having the large amplitude in the signal propagation is spaced away from the substrate and the first dielectric layer, and even when the variation in thickness of the first dielectric layers occurs during manufacturing, the variations in band width ratios of the surface acoustic wave elements are able to be reduced or prevented.

Further, the first dielectric layer may include silicon oxide.

According to this configuration, even when the variations in the thicknesses of the first dielectric layers including silicon oxide occur during manufacturing, the variations in the band width ratios of the surface acoustic wave elements are able to be reduced or prevented.

Further, the surface acoustic wave element may include a second dielectric layer provided directly or indirectly on the IDT electrode, and the first dielectric layer may have a thickness thinner than that of the second dielectric layer.

In this manner, by making the first dielectric layer, which is a layer to adjust the electromechanical coupling coefficient, thinner than the second dielectric layer, it is possible to reduce the variation dimension in the thickness of the first dielectric layers. Thus, in the plurality of surface acoustic wave elements after manufacturing, the variations in the band width ratios are able to be reduced or prevented.

In addition, when a high-frequency signal is input to the IDT electrode, a generation position of a maximum amplitude of vibration generated in the surface acoustic wave element may be located in the second dielectric layer.

According to this, the generation position of the maximum amplitude in the signal propagation is spaced away from the substrate and the first dielectric layer. Therefore, even when the variations in the thicknesses of the first dielectric layers occur during manufacturing, it is possible to reduce or prevent the variations in the band width ratios of the surface acoustic wave elements.

According to preferred embodiments of the present invention, it is possible to reduce or prevent the variations in the band width ratios of the surface acoustic wave elements.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 4A and 4B include diagrams illustrating vibration distributions of cross sections of the surface acoustic wave elements, wherein FIG. 4A is the vibration distribution when a Rayleigh wave is generated (the preferred embodiment), and FIG. 4B is the vibration distribution when a Love wave is generated (the comparative example).

DETAILED DESCRIPTION OF THE PREFERRED EMBODIMENTS

Figures 1, 2:
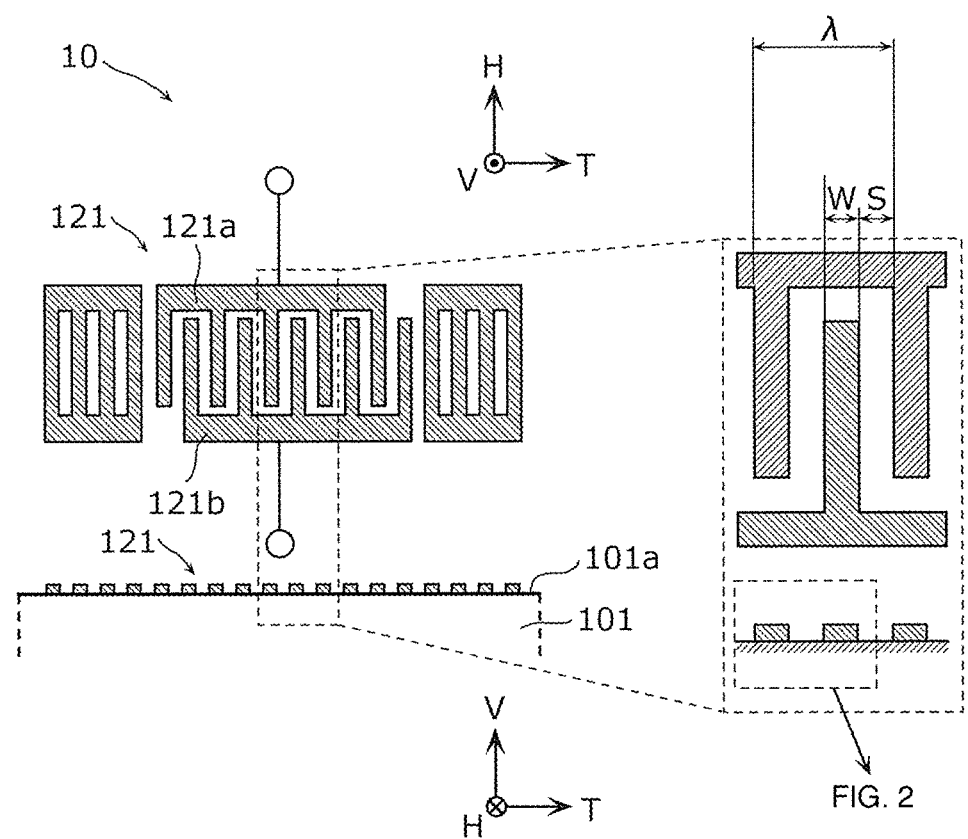
FIG. 1 includes a plan view and a cross-sectional view schematically illustrating a surface acoustic wave element according to a preferred embodiment of the present invention.
FIG. 2 is a cross-sectional view illustrating details of a substrate and an IDT electrode of a surface acoustic wave element according to a preferred embodiment of the present invention.
Figure 2:
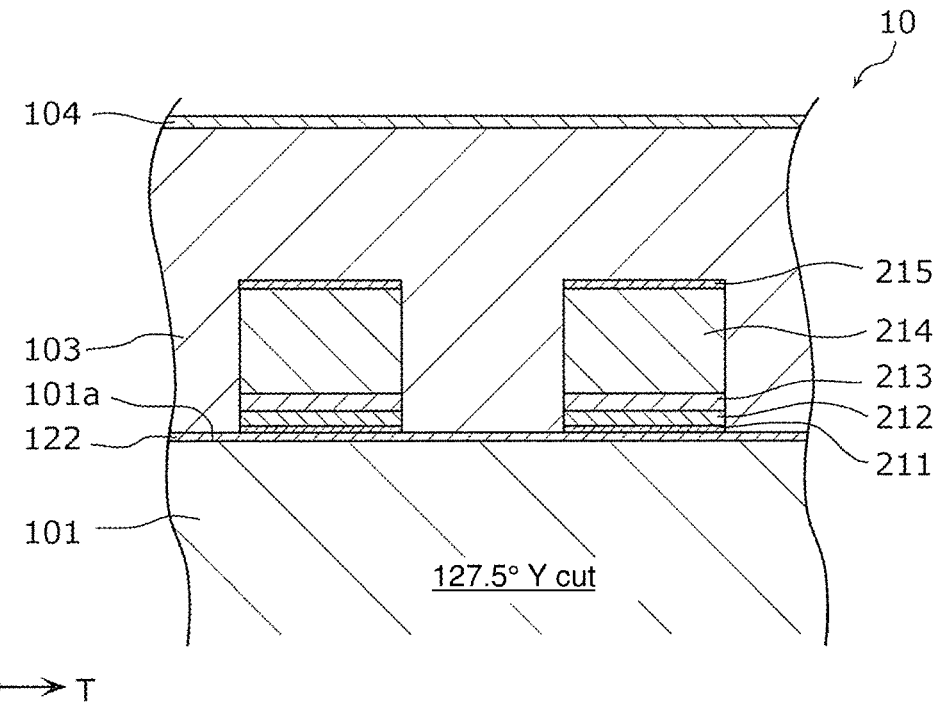

Hereinafter, preferred embodiments of the present invention will be described in detail with reference to examples and drawings. The preferred embodiments described below are all inclusive or specific examples. The numerical values, shapes, materials, elements, and arrangement and connection configurations of the elements shown in the following preferred embodiments are merely examples, and are not intended to limit the present invention. Among the elements in the following preferred embodiments, constituent elements that are not described in the independent claims will be described as arbitrary or optional elements. Also, the sizes or size ratios of the elements illustrated in the drawings are not necessarily strict. In addition, in the drawings, the same reference characters are used for the same or substantially the same configurations, and descriptions thereof may be omitted or simplified.

A surface acoustic wave element is used as an element of a surface acoustic wave filter to filter and output an input high-frequency signal, for example.

FIG. 1 includes a plan view and a cross-sectional view schematically illustrating a surface acoustic wave element 10 according to a preferred embodiment of the present invention. FIG. 2 is a cross-sectional view illustrating details of a substrate 101 and an IDT electrode 121 of the surface acoustic wave element 10. Hereinafter, a direction in which a surface acoustic wave is propagated along a principal surface 101a of the substrate 101 is defined as a T direction, a direction perpendicular or substantially perpendicular to the principal surface 101a is defined as a V direction, and a direction perpendicular or substantially perpendicular to both the T direction and the V direction is defined as an H direction.

As illustrated in FIG. 1, the surface acoustic wave element 10 includes the substrate 101, a first dielectric layer 122 provided on the substrate 101, the IDT electrode 121 provided on the first dielectric layer 122, a second dielectric layer 103, and a protective layer 104. The surface acoustic wave element 10 of the present preferred embodiment propagates a high-frequency signal on the substrate 101 using a Rayleigh wave generated on the substrate 101 when the high-frequency signal is input to the IDT electrode 121.

The substrate 101 preferably includes, for example, a 127.5° Y-cut X-propagation LiNbO$_3$ piezoelectric single crystal, and has a structure in which a high-frequency signal is propagated using a Rayleigh wave. In order to utilize the Rayleigh wave, a Y-cut angle of the LiNbO$_3$ piezoelectric single crystal may preferably be at least a predetermined Y-cut angle within a range equal to or larger than about 100° and equal to or smaller than about 160°, for example. More preferably, the Y-cut angle of the LiNbO$_3$ piezoelectric single crystal may be a predetermined Y-cut angle within a range equal to or larger than about 120° and equal to or smaller than about 130°, for example.

Further, the substrate 101 may be a substrate having piezoelectricity in at least a portion thereof. For example, the substrate 101 may include a piezoelectric thin film (piezoelectric body) on a surface, and be a multilayer body including a film having a different acoustic velocity from that of the piezoelectric thin film, a supporting substrate, and the like, for example. The substrate 101 may have piezoelectricity over the entire substrate. In this case, the substrate 101 is a piezoelectric substrate including one layer of piezoelectric layer.

As illustrated in FIG. 1, the IDT electrode 121 includes a pair of comb-shaped electrodes 121a and 121b that face each other. Each of the comb-shaped electrodes 121a and 121b includes a plurality of electrode fingers that are parallel or substantially parallel to each other and a busbar electrode that connects the plurality of electrode fingers. The plurality of electrode fingers extend along the H direction orthogonal or substantially orthogonal to the T direction. In the surface acoustic wave element 10, a wave length of an acoustic wave to be excited is defined by design parameters, such as a repetition period λ of the plurality of electrode fingers, a duty ratio W/(W+S), and the like.

As illustrated in FIG. 2, the IDT electrode 121 is formed by laminating a metal film 211, a metal film 212, a metal film 213, a metal film 214, and a metal film 215 in this order from a side of the substrate 101.

The metal film 211 is preferably an adhesion film to improve close contact to the substrate 101, and is made of, for example, a NiCr material having a thickness of about 10 nm. The metal film 212 is preferably a main electrode to confine energy of an acoustic wave, and is made of, for example, a Pt material having a thickness of about 40 nm. The metal film 213 is preferably a barrier film to reduce or prevent mutual diffusion between the metal film 212 and the metal film 214, and is made of, for example, a Ti material having a thickness of about 10 nm. The metal film 214 is preferably a conductive film to improve conductivity of the electrode fingers, and is made of, for example, an AlCu alloy material having a thickness of about 159 nm and a low resistance value. The metal film 215 is preferably an adhesion film to improve adhesion to the second dielectric layer 103, and is made of, for example, a Ti material having a thickness of about 10 nm. The metal film 212 made of, for example, Pt is the highest-density metal film among the plurality of metal films 211 to 215 of the multilayer body. Further, the metal films 211, 213, 214 and 215 define metal films other than the metal film 212 having the highest density.

The first dielectric layer 122 adjusts an electromechanical coupling coefficient and is disposed between the substrate 101 and the IDT electrode 121. The first dielectric layer 122 is preferably, for example, a silicon oxide layer having a thickness of about 1 nm, and is formed by sputtering.

The second dielectric layer 103 improves the temperature coefficient of frequency and protects the IDT electrode 121 from an external environment. The second dielectric layer 103 is preferably, for example, a silicon oxide layer having a thickness of about 30 nm, and is provided on the first dielectric layer 122 so as to cover the IDT electrode 121.

The first dielectric layer 122 preferably has a thickness less than that of the second dielectric layer 103. The thickness of the first dielectric layer 122 is approximately 1/30 of the thickness of the second dielectric layer 103. A total thickness of the IDT electrodes 121 is preferably the same or substantially the same as the thickness of the second dielectric layer 103.

The protective layer 104 adjusts a frequency and protects the IDT electrode 121 from the external environment. The protective layer 104 is preferably, for example, a SiN layer, and is provided on the second dielectric layer 103.

Note that the configurations of the surface acoustic wave element 10 illustrated in FIGS. 1 and 2 are merely examples, and are not limited thereto. The number and length of the electrode fingers of the IDT electrode 121 are not limited thereto. The IDT electrode 121 may be a single layer of a metal film instead of a multilayer structure including metal films. Moreover, materials of each of the metal films and each of the protective layers are not limited to those described above. The IDT electrode 121 may be made of, for example, a metal such as Ti, Al, Cu, Pt, Au, Ag, Pd or the like or an alloy, or may include a plurality of multilayer bodies made of the metal or alloy described above. The configurations of the second dielectric layer 103, the protective layer 104, and the first dielectric layer 122 are not limited to the above-described configurations, and may be made of, for example, a dielectric or an insulator such as $SiO_2$, SiN, AlN, polyimide, or a multilayer body thereof.

The surface acoustic wave element 10 having the above configuration is able to reduce or prevent the variation in the band width ratio when compared to a comparative example that is a surface acoustic wave element using a Love wave. To facilitate this understanding, the configuration of the surface acoustic wave element in the comparative example will be described.

Figure 3:
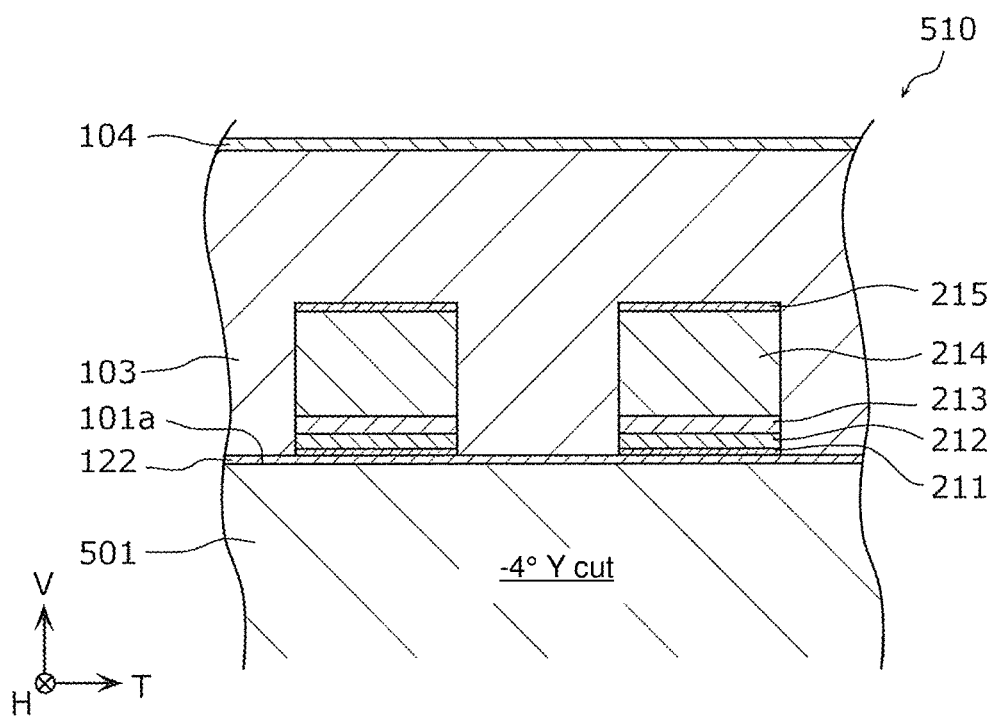
FIG. 3 is a cross-sectional view illustrating details of a substrate and an IDT electrode of a surface acoustic wave element according to a comparative example.

FIG. 3 is a cross-sectional view illustrating details of a substrate 501 and the IDT electrode 121 of a surface acoustic wave element 510 in the comparative example.

The surface acoustic wave element 510 in the comparative example uses a Love wave generated on the substrate 501 when a high-frequency signal is input to the IDT electrode 121, to propagate the high-frequency signal on the substrate 501. The substrate 501 includes a −4° Y-cut X-propagation $LiNbO_3$ piezoelectric single crystal, and has a structure in which the high-frequency signal is propagated using the Love wave. Other configurations are the same or substantially the same as those of the present preferred embodiment, and descriptions thereof will be omitted.

FIGS. 4A and 4B include diagrams illustrating vibration distributions (simulation results) of cross sections of the surface acoustic wave elements, and FIG. 4A is the vibration distribution when a Rayleigh wave is generated (the present preferred embodiment), and FIG. 4B is the vibration distribution when a Love wave is generated (the comparative example). A signal having power of about 1 W is input to each of the surface acoustic wave elements.

Each of the vibration distributions in FIGS. 4A and 4B indicate a magnitude of an amplitude at each coordinate point. The amplitude in FIG. 4A indicating a Rayleigh wave that includes vibration components in the V direction and the T direction, and the amplitude in FIG. 4B indicating a Love wave that includes a vibration component in the H direction.

In FIG. 4A, a region having a large amplitude is represented by hatching with oblique lines at a narrow pitch, and a region having a small amplitude is represented by hatching with oblique lines at a wide pitch. A generation position of a maximum amplitude a1 is not located inside the IDT electrode 121 but is located inside the second dielectric layer 103. A difference between the maximum amplitude a1 and a minimum amplitude a2 is approximately 5 nm. In FIG. 4B, a region having a large amplitude is represented by hatching with oblique lines at a narrow pitch, and a region having a small amplitude is represented by hatching with oblique lines at a wide pitch. A generation position of a maximum amplitude a3 is located in the electrode finger. A difference between the maximum amplitude a3 and a minimum amplitude a4 is approximately 12 nm.

In the surface acoustic wave element 510 in the comparative example, as illustrated in FIG. 4B, the region having the large amplitude is located in a vicinity of the substrate 501 and the first dielectric layer 122. Therefore, the variation in the band width ratio is likely to occur in the plurality of surface acoustic wave elements 510 after manufacturing due to the variation in the thickness of the first dielectric layers 122 occurring in the manufacturing process of the surface acoustic wave elements 510.

In contrast, in the surface acoustic wave element 10 according to the present preferred embodiment, as illustrated in FIG. 4A, the region having the large amplitude is located above the IDT electrode 121, and is spaced away from the substrate 101 and the first dielectric layer 122, when compared to the surface acoustic wave element 510. Therefore, even when the variation in the thickness of the first dielectric layers 122 occurs during manufacturing, it is unlikely to be affected by the variation in the thickness, and the variation in the band width ratio of the plurality of surface acoustic wave elements 10 after manufacturing is reduced or prevented.

That is, the surface acoustic wave element 10 according to the present preferred embodiment includes the substrate 101 including the $LiNbO_3$ piezoelectric single crystal, the first dielectric layer 122 provided on the substrate 101, and the IDT electrode 121 provided on the first dielectric layer 122, and uses the Rayleigh wave generated on the substrate 101 when a high-frequency signal is input to the IDT electrode 121, to propagate the high-frequency signal on the substrate 101.

In the surface acoustic wave element 10 that propagates the high-frequency signal using the Rayleigh wave as described above, the region having the large amplitude in the signal propagation is spaced away from the substrate 101 and the first dielectric layer 122. Therefore, even when the variation in the thickness of the first dielectric layers 122 occurs during manufacturing, the variation in the band width ratio is able to be reduced or prevented in the plurality of surface acoustic wave elements 10 after manufacturing.

Although the surface acoustic wave element according to the preferred embodiments of the present invention has been described above, the present invention is not limited to the above preferred embodiments. Other preferred embodiments that are achieved by combining any of the elements in the above preferred embodiments and variations obtained by making various modifications to the above preferred embodiments that may be conceived by those skilled in the art without departing from the gist of the present invention with respect to the above preferred embodiments, and various filters and devices incorporating a surface acoustic wave element according to preferred embodiments of the present invention are also included in the present invention.

Preferred embodiments of the present invention are widely applicable to an acoustic wave filter, a multiplexer, a high-frequency front-end circuit, a communication device, and the like as a surface acoustic wave element having a small variation in the band width ratio.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A surface acoustic wave element comprising:
   a substrate including a $LiNbO_3$ piezoelectric single crystal;
   a first dielectric layer provided directly or indirectly on the substrate;
   an IDT electrode provided directly or indirectly on the first dielectric layer; and a second dielectric layer provided directly or indirectly on the IDT electrode; wherein at least a portion of the first dielectric layer is provided between the IDT electrode and the substrate;

the first dielectric layer has a thickness less than a thickness of the second dielectric layer;

a high-frequency signal is propagated on the substrate using a Rayleigh wave; and when a high-frequency signal is input to the IDT electrode, a generation position of a maximum amplitude of vibration generated in the surface acoustic wave element is located in the second dielectric layer.

2. The surface acoustic wave element according to claim 1, wherein a Y-cut angle of the $LiNbO_3$ piezoelectric single crystal is equal to or larger than about 100° and equal to or smaller than about 160°.

3. The surface acoustic wave element according to claim 1, wherein the first dielectric layer includes silicon oxide.

4. The surface acoustic wave element according to claim 3, wherein the first dielectric layer has a thickness of about 1 nm.

5. The surface acoustic wave element according to claim 1, wherein a Y-cut angle of the $LiNbO_3$ piezoelectric single crystal is equal to or larger than about 120° and equal to or smaller than about 130°.

6. The surface acoustic wave element according to claim 1, wherein the second dielectric layer is made of silicon oxide.

7. The surface acoustic wave element according to claim 1, wherein the first dielectric layer has a thickness of about 1/30 of a thickness of the second dielectric layer.

8. The surface acoustic wave element according to claim 1, wherein a total thickness of the IDT electrode is the same or substantially the same as a thickness of the second dielectric layer.

9. The surface acoustic wave element according to claim 1, further comprising a protective layer provided on the second dielectric layer.

10. The surface acoustic wave element according to claim 9, wherein the protective layer is made of SiN.

11. A surface acoustic wave element comprising:
a substrate including a $LiNbO_3$ piezoelectric single crystal;
a first dielectric layer provided directly or indirectly on the substrate; and
an IDT electrode provided directly or indirectly on the first dielectric layer; wherein
at least a portion of the first dielectric layer is provided between the IDT electrode and the substrate;

a high-frequency signal is propagated on the substrate using a Rayleigh wave;

the IDT electrode includes first, second, third, fourth, and fifth metal films that are laminated in this order from a side of the substrate;

the first metal film is an adhesion film made of NiCr;

the second metal film is a main electrode made of Pt;

the third metal film is a barrier film to reduce or prevent diffusion between the second metal film and the fourth metal film, and is made of Ti;

the fourth metal film is a conductive film made of an AlCu alloy material; and the fifth metal film is an adhesion film made of Ti.

12. The surface acoustic wave element according to claim 11, wherein the first metal film has a thickness of about 10 nm;

the second metal film has a thickness of about 40 nm;

the third metal film has a thickness of about 10 nm;

the fourth metal film has a thickness of about 150 nm; and the fifth metal film has a thickness of about 10 nm.

13. The surface acoustic wave element according to claim 11, wherein a Y-cut angle of the $LiNbO_3$ piezoelectric single crystal is equal to or larger than about 100° and equal to or smaller than about 160°.

14. The surface acoustic wave element according to claim 11, wherein the first dielectric layer includes silicon oxide.

15. The surface acoustic wave element according to claim 14, wherein the first dielectric layer has a thickness of about 1 nm.

16. The surface acoustic wave element according to claim 11, wherein a Y-cut angle of the $LiNbO_3$ piezoelectric single crystal is equal to or larger than about 120° and equal to or smaller than about 130°.

17. The surface acoustic wave element according to claim 11, further comprising:
a second dielectric layer provided directly or indirectly on the IDT electrode; wherein
the first dielectric layer has a thickness less than a thickness of the second dielectric layer.

18. The surface acoustic wave element according to claim 17, wherein the first dielectric layer has a thickness of about 1/30 of a thickness of the second dielectric layer.

19. The surface acoustic wave element according to claim 17, wherein a total thickness of the IDT electrode is the same or substantially the same as a thickness of the second dielectric layer.

20. The surface acoustic wave element according to claim 17, further comprising a protective layer provided on the second dielectric layer.

* * * * *